United States Patent
Burl et al.

(10) Patent No.: US 6,593,744 B2
(45) Date of Patent: Jul. 15, 2003

(54) MULTI-CHANNEL RF CABLE TRAP FOR MAGNETIC RESONANCE APPARATUS

(75) Inventors: Michael Burl, Chagrin Falls, OH (US); Thomas Chmielewski, Willoughby Hills, OH (US); William O. Braum, Twinsburg, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/989,824

(22) Filed: Nov. 20, 2001

(65) Prior Publication Data

US 2003/0094950 A1 May 22, 2003

(51) Int. Cl.[7] ................................................. G01V 3/00
(52) U.S. Cl. ........................ 324/322; 324/318; 324/309
(58) Field of Search ................................ 324/322, 307, 324/318, 309, 311, 312, 313, 320

(56) References Cited

U.S. PATENT DOCUMENTS

| | | | |
|---|---|---|---|
| 4,707,662 A | 11/1987 | Kemner et al. | 324/322 |
| 4,725,780 A | 2/1988 | Yoda et al. | 324/322 |
| 4,793,356 A | 12/1988 | Misic et al. | 324/318 |
| 4,839,594 A | 6/1989 | Misic et al. | 324/318 |
| 4,859,950 A | 8/1989 | Keren | 324/322 |
| 4,918,388 A | 4/1990 | Mehdizadeh et al. | 324/322 |
| 4,920,318 A | 4/1990 | Misic et al. | 324/318 |
| 5,144,240 A | 9/1992 | Mehdizadeh et al. | 324/322 |
| 5,280,248 A | 1/1994 | Zou et al. | 324/318 |
| 5,542,713 A | * 8/1996 | Arakawa et al. | 324/322 |
| 5,743,165 A | * 4/1998 | Snelten et al. | 324/318 |

* cited by examiner

Primary Examiner—Edward Lefkowitz
Assistant Examiner—Brij B. Shrivastav
(74) Attorney, Agent, or Firm—Fay, Sharpe, Fagan, Minnich & McKee, LLP

(57) ABSTRACT

A multi-channel RF cable trap (70) blocks stray RF current from flowing on shield conductors (114) of coaxial RF cables (60) of a magnetic resonance apparatus. An inductor (116) is formed by a curved semi-rigid trough (80) constructed of an insulating material coated with an electrically conducting layer. Preferably, the inductor (116) and the cable follow an "S"-shaped path to facilitate good electromagnetic coupling therebetween. The RF cables (60) are laid in the trough (80) and the shield conductors inductively couple with the inductor (116). A capacitor (82) and optional trim capacitor (83) are connected across the the trough of the inductor (116) to form a resonant LC circuit tuned to the resonance frequency. The LC circuit inductively couples with the shield conductors (114) to present a high, signal attenuating impedance at the resonance frequency. The resonant circuit is preferably contained in an RF-shielding box (84) with removable lid.

22 Claims, 6 Drawing Sheets

MULTI-CHANNEL RF CABLE TRAP FOR MAGNETIC RESONANCE APPARATUS

BACKGROUND OF THE INVENTION

The present invention relates to the radio frequency (RF) signal handling arts. It finds particular application in conjunction with medical magnetic resonance imaging systems and will be described with particular reference thereto. It is to be appreciated, however, that the invention will also find application in conjunction with other types of magnetic resonance imaging systems, magnetic resonance spectroscopy systems, and the like, as well as in other arts with analogous radio frequency signal handling.

In magnetic resonance imaging, a strong uniform static magnetic field $B_0$ is generated, often by a superconducting magnet. The static magnetic field $B_0$ polarizes the nuclear magnetic spin system of an object to be imaged. A solenoid superconducting magnet generates the static magnetic field, $B_0$, along its own longitudinal axis and the common longitudinal axis of the cylindrical bore of the vacuum vessel, commonly denoted as the z-axis. Alternately, the $B_0$ field is generated in an open region between a pair of poles.

To generate a magnetic resonance signal, the polarized spin system is first excited by applying a magnetic resonance excitation signal or radio frequency magnetic field $B_1$, perpendicular to the z-axis. This RF field $B_1$ is typically produced by an RF coil located inside the bore of a bore-type magnet or adjacent the pole of an open magnet and closely conforming thereto to maximize the space available to receive a patient. The RF magnetic field is turned on and off to create short RF pulses to excite and manipulate magnetization in the polarized object in the bore. More specifically, the RF excitation pulses tip the magnetization out of alignment with the z-axis and cause its macroscopic magnetic moment vector to precess around the z-axis. The precessing magnetic moment, in turn, generates a radio frequency magnetic resonance signal. Additional RF pulses are commonly applied to manipulate the resonance to form enhanced signal strength RF echoes which are received by the same RF coil or a local RF coil positioned near a region of interest.

In magnetic resonance imaging, it is advantageous for the RF coil to have high sensitivity, high RF power efficiency, and a high signal-to-noise ratio. Also, the $B_1$ magnetic field which is generated should be uniform. The sensitivity of the RF coil is defined as the magnetic field $B_1$ created by a unit current. The signal-to-noise ratio is proportional to the sensitivity and to the square root of the coil quality factor, Q.

To encode a sample spatially, magnetic field gradients are applied concurrent with and after the RF excitation. The gradient magnetic fields are typically applied in pulses to generate magnetic field gradients $G_x$, $G_y$ and $G_z$ linearly along the x, y, and z-directions, respectively, or along other selected coordinate systems. The gradient pulses typically are generated by gradient magnetic field coils which are also located inside the bore of a bore-type magnet or adjacent the poles of an open-type magnet. Commonly, the gradient field coils are mounted in back of the RF coil in the bore or on the pole piece.

A sequence control circuit controls the gradient pulses and the transmitter to generate a plurality of imaging sequences. For the selected sequence, the receive coil receives one or a plurality of echoes in rapid succession following each RF excitation pulse. Gradient pulses are typically applied before and during reception of resonance echoes and between echoes in multi-echo sequences. An analog-to-digital converter converts each data line to a digital format. Ultimately, the radio frequency signals are demodulated by a receiver located remote from the magnetic field and reconstructed into an image representation by a reconstruction processor which applies a two-dimensional Fourier transform or other appropriate reconstruction algorithm. The image may represent a planar slice through the patient, an array of parallel planar slices, a three-dimensional volume, or the like.

Radio frequency coils are generally connected to the RF transmitter and/or the RF receiver of the magnetic resonance system using coaxial cable. Coaxial cable is designed to protect the system from picking up extraneous RF signals which are present in the environment. Coaxial cables feature a surrounding shield or ground conductor separated from a current carrying central conductor by a dielectric material. The surrounding ground conductor acts as a shield that minimizes the pick-up of foreign frequencies by the central conductor of the cable.

Although coaxial cable is used, there are still coupling problems at resonance frequencies, such as 63 MHz for hydrogen dipoles in a 1.5 T $B_0$ field. Among other things, the shield conductor of the coaxial cable itself tends to carry foreign induced currents, such as from TV transmissions, stray harmonics from the gradient pulse oscillators and clocking circuits in nearby equipment, and the like. The induced current is often referred to as "skin current" because it flows on the outside of the shield conductor. The stray RF current tends to flow out of the bore and into other circuits, such as the amplifiers, analog-to-digital converters, receivers, and reconstruction processor to contribute errors in the resultant image.

Balance/unbalance ("Balun") circuitry is used as one means for reducing, or "trapping", the noise and/or stray RF currents generated due to induced currents in the coaxial cable. Baluns of the prior art consisted of an LC frequency filter for each cable located in a copper shielded box. The balun was tuned to the frequency of interest, such as by a tuning capacitor.

The baluns of the prior art were problematic for a number of reasons. First, the baluns were inserted in-line. Each coaxial cable was interconnected with a balun. As the number of RF channels increases, the number of coaxial connections becomes labor-intensive. Second, the baluns were space-consuming. Space limitations become more problematic as the number of channels increases and more baluns are necessary. In magnetic resonance scanners, there are severe space limitations. In bore type magnets, there is pressure to reduce the magnet diameter for lower cost competing with pressure to enlarge the patient receiving bore. Similarly, in openmagnets, there are competing pressures to move pole pieces closer and to enlarge the patient gap. This compresses the space available for RF coils, gradient coils, shims, baluns, and other associated structures. Third, the baluns were expensive due to the use of special non-magnetic tuning capacitors.

Compounding the aforementioned disadvantages, there is a consumer demand for magnetic resonance scanners with greater numbers of RF output channels, such as a channel for each quadrature mode, a channel for each individual coil or coil mode of an array, or the like. The multiple connection of parallel baluns reduces their effectiveness to block stray RF currents. Also, space consuming problems are magnified as the number of baluns increases. Finally, multiple baluns multiply the cost.

The present invention contemplates a new and improved design for trapping the noise and/or stray RF currents generated due to induced currents in the coaxial cable, which overcomes the above-referenced problems and others.

SUMMARY OF THE INVENTION

In accordance with one aspect of the present invention, a magnetic resonance apparatus is disclosed, having a main magnet which generates a main magnetic field through an examination region, at least one RF coil assembly positioned adjacent the examination region, a radio frequency transmitter which drives the RF coil assembly to excite magnetic resonance dipoles in a RF transmit field within the examination region, a multi-channel receiver connected by shielded transmission cables to at least one RF coil assembly which receives and demodulates the magnetic resonance signals, and further including a multi-channel RF cable trap inductively coupled to the shielded transmission cables to block stray induced RF currents and noise from entering the receiver.

In accordance with another aspect of the present invention, a multi-channel RF trap is disclosed for blocking stray signals on a plurality of shielded RF cables which each have a peripheral shield conductor and at least one inner conductor for carrying RF signals, the multi-channel RF trap comprising: a conductive layer inductively coupled to the shield conductors of the plurality of shielded RF cables; and a capacitive element connected with the conductive layer, the capacitive element being sized and the conductive layer being shaped such that the capacitive element and the conductive layer define an LC circuit with a resonance frequency at a frequency of RF signals carried on the inner conductor.

In accordance with another aspect of the present invention, a method of magnetic resonance is disclosed, comprising: exciting magnetic resonance in dipoles of a subject such that magnetic resonance signals are generated at least at a resonance frequency; picking up resonance signals and conveying the resonance signals on a center conductor of a cable, which center conductor is surrounded by a shield conductor; inductively attenuating signals on the shield conductor within a frequency spectrum that encompasses the resonance frequency; and demodulating the resonance signals from the center conductor.

In accordance with yet another aspect of the present invention, a method for trapping RF currents in a shielded cable carrying signals at a working RF frequency is disclosed, the method comprising inductively coupling a spatially distributed resonant electrical circuit in close proximity to the shielded cable, the resonant electrical circuit having a sufficiently high impedance at the working RF frequency to attenuate stray RF currents and noise in the cable.

One advantage of the present invention is that it minimizes the space required for the RF cable trap, especially in the case of a large number of cables.

Another advantage of the present invention is its multiple cable capacity.

Another advantage of the present invention resides in easier insertion and removal of cables. In-line cable connections are eliminated.

Yet another advantage of the present invention is that it is cost effective.

Still further advantages and benefits of the present invention will become apparent to those of ordinary skill in the art upon reading and understanding the following detailed description.

BRIEF DESCRIPTION OF THE DRAWINGS

The invention may take form in various components and arrangements of components. The drawings are only for the purposes of illustrating preferred embodiments and are not to be construed as limiting the invention.

DETAILED DESCRIPTION OF THE PREFERRED EMBODIMENTS

Figure 1:
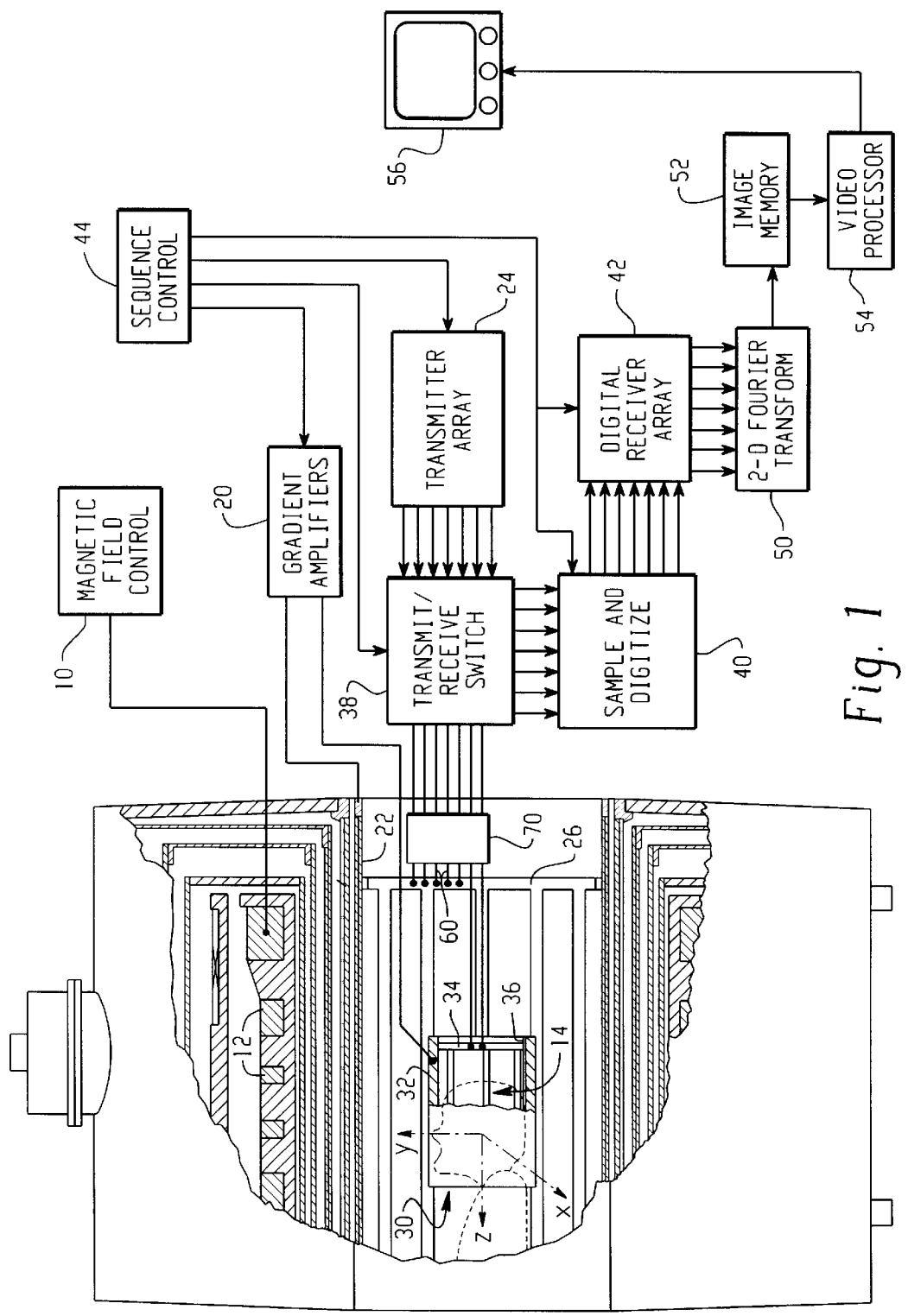
FIG. 1 is a diagrammatic illustration of a magnetic resonance imaging apparatus employing an RF cable trap in accordance with the present invention.

With reference to FIG. 1, a main magnetic field control 10 controls superconducting or resistive magnets 12 such that a substantially uniform, temporally constant main magnetic field $B_0$ is created along a z-axis through an examination region 14. Although a bore-type magnet is illustrated in FIG. 1, it is to be appreciated that the present invention is equally applicable to open magnet systems. A magnetic resonance sequence applies a series of radio frequency (RF) magnetic field pulses $B_1$ and magnetic field gradient pulses $G_x$, $G_y$, $G_z$ to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients $G_x$, $G_y$, $G_z$ along the x, y and z-axes of the examination region 14. One or more digital radio frequency transmitters 24 transmit radio frequency pulses or pulse packets to a whole-body quadrature RF coil 26 to transmit $B_1$ pulses into the examination region. A typical radio frequency $B_1$ pulse is composed of a packet of immediately contiguous pulse segments of short duration which taken together with each other and any applied gradients achieve a selected magnetic resonance manipulation. The $B_1$ pulses are used to saturate, excite resonance, invert magnetization, refocus resonance, or manipulate resonance in selected portions of the examination region. For whole-body applications, the resonance signals are commonly picked up in quadrature by the whole body RF coil 26.

For generating images of limited regions of the subject, local coils are commonly placed contiguous to the selected region. For example, an insertable head coil 30 is inserted surrounding a selected brain region at the isocenter of the bore. Optionally, the insertable head coil includes local gradient coils 32 which receive current pulses from the gradient amplifiers 20 to create magnetic field gradients along the x, y, and z-axes in the examination region within the head coil. A local quadrature radio frequency coil or coil array 34 is used to excite magnetic resonance and receive magnetic resonance signals emanating from the patient's head. Alternatively, a receive-only local radio frequency coil can be used for quadrature reception of resonance signals introduced by body-coil RF transmissions. An RF screen 36 screens the RF signals from the RF head coil from inducing any currents in the gradient coils and the surrounding structures. The resultant radio frequency signals are picked up in quadrature by the whole body RF coil 26, the local RF coil 34, or other specialized RF coils or coil arrays. A transmit/receive switch 38 switches the coils into connection with the transmitters 24 and/or sampling and digitizing circuits 40 in accordance with the selected magnetic resonance sequence. The digitized resonance data are demodulated by an array of digital receivers 42. Although seven connection cables are illustrated for simplicity of illustration, preferably a larger number of cables and channels are provided, e.g. twenty or more.

A sequence control processor 44 controls the gradient pulse amplifiers 20 and the transmitter 24 to generate any of a plurality of magnetic resonance imaging and spectroscopy sequences, such as echo-planar imaging, echo-volume imaging, gradient and spin echo imaging, fast spin echo imaging, and the like. For the selected sequence, the receivers 42 demodulate a plurality of data lines in rapid succession following an RF excitation pulse. Ultimately, the data lines are reconstructed into an image representation by a reconstruction processor 50 which applies a two-dimensional Fourier transform or other appropriate reconstruction algorithm. The image may represent a planar slice through the patient, an array of parallel planar slices, a three-dimensional volume, or the like. The image is then stored in an image memory 52. A video processor 54 accesses the memory and converts the data to appropriate format for a monitor 56 which provides a human-readable display of the resultant image.

With continuing reference to FIG. 1, the radio frequency coils 26, 34 in the magnetic resonance imaging system are connected to the transmit/receive switch 38 by RF lines or cables 60. Preferably, the RF lines 60 are coaxial cable. Such coaxial cable protects the system from picking up extraneous RF signals and noise which are present in the environment.

Typically, coaxial cable features a braided, tubular conductor which is separated from a current-carrying central conductor by a dielectric material. The tubular outer conductor is grounded to act as a shield that minimizes the pick-up of foreign frequencies by the central conductor.

Although coaxial cable is used, there are still coupling problems at the high frequencies associated with magnetic resonance imaging and spectroscopy. Among other things, the braiding of the coaxial cable itself tends to carry foreign induced currents or "skin currents." The stray RF current tends to flow along the cable out of the bore and into other circuits in the magnetic resonance apparatus.

A multi-channel RF cable trap or balun 70 is coupled with each RF line 60 near the point where it leaves the RF magnetic field to keep stray RF from flowing out of the bore. The multi-channel RF cable trap 70 blocks stray RF currents in each of the RF lines 60. As illustrated in FIG. 1, the multi-channel RF cable trap 70 is coupled with each RF line 60 at a point near where the line leaves the RF magnetic field between the RF coil assembly 26 and the transmit/receive switch 38. Optionally, additional RF cable traps are coupled to cables connecting the RF coil assembly 26, 34, just outside the bore of the magnetic resonance imaging apparatus, just before the transmit/receive switch 38 and at intervals between the bore and the receivers 42. Incorporating several multi-channel RF cable traps between the RF coil assembly 26 and the receivers 42 filters stray RF currents as they are received without letting them accumulate and interact.

With continuing reference to FIG. 1, and further reference to FIG. 2, the RF cable trap 70 comprises a spatially distributed inductor which in the preferred embodiment is a curved semi-rigid trough or channel 80, constructed of an insulating material coated with an electrically conducting layer, and into which the RF cables 60 are laid. In a preferred embodiment, the insulating material is acrylonitrile butadiene styrene resin (i.e., ABS) and the electrically conducting coating is a layer of metallic paint, such as a silver and copper alloy paint. This combination is preferred due to the strong adhesion of the paint to ABS and the favorable electrical properties of silver and copper alloy paint. Electroplating, metallization, and other coating and treating processes are also contemplated. The electrically conducting film is substantially thicker than the RF skin depth which is a function of both RF frequency and conducting material, but is also thin enough to prevent formation of undesirable eddy currents. In the preferred embodiment, a film thickness of 1–4 $\mu$m is used. The trough 80 is shown in an "S" shape, which is the preferred shape as being spatially compact with good inductive coupling to the cables, but this shape is not critical and other curves or even a straight trough may work as well. Similarly, in the preferred embodiment the trough has a rectangular vertical cross-section, but a "U"-shaped cross-section or other shapes may work as well.

A resonant circuit is formed by electrically connecting a tuning capacitor 82 across the "S" shaped trough. The tuning capacitor may be a fixed capacitor selected to match the resonant circuit to a standard magnetic resonance frequency such as the 63 MHz Larmor frequency of hydrogen dipoles in a 1.5 T $B_0$ field. It is preferably a tunable capacitor, by which the RF cable trap is tuned to match a range of frequencies. Optionally, a smaller trim capacitor 83 is provided in parallel with tuning capacitor 82, which allows more precise adjustment of the resonant frequency.

The inductance of the channel 80 is determined by its construction and by its spatial dimensions. In the preferred embodiment the trough 80 has a length that is between a quarter and a twentieth of a wavelength at the resonance frequency. For the preferred embodiment using an example design frequency of 63 MHz, the inductance of the "S" shaped trough 80 is about 160 nH. The tuning. capacitor 82 is preferably selected as 39 pF, with the trim capacitor 83 being adjusted to precisely match the resonance frequency. For this design, the impedance at 63 MHz is about 2250 ohms. In some cases, it has been found that the natural capacitances of the balun 70 and/or RF cables 60 are adequate to effectuate operation of the balun 70, in which cases the capacitors 82, 83 are optionally omitted.

Figure 2A:
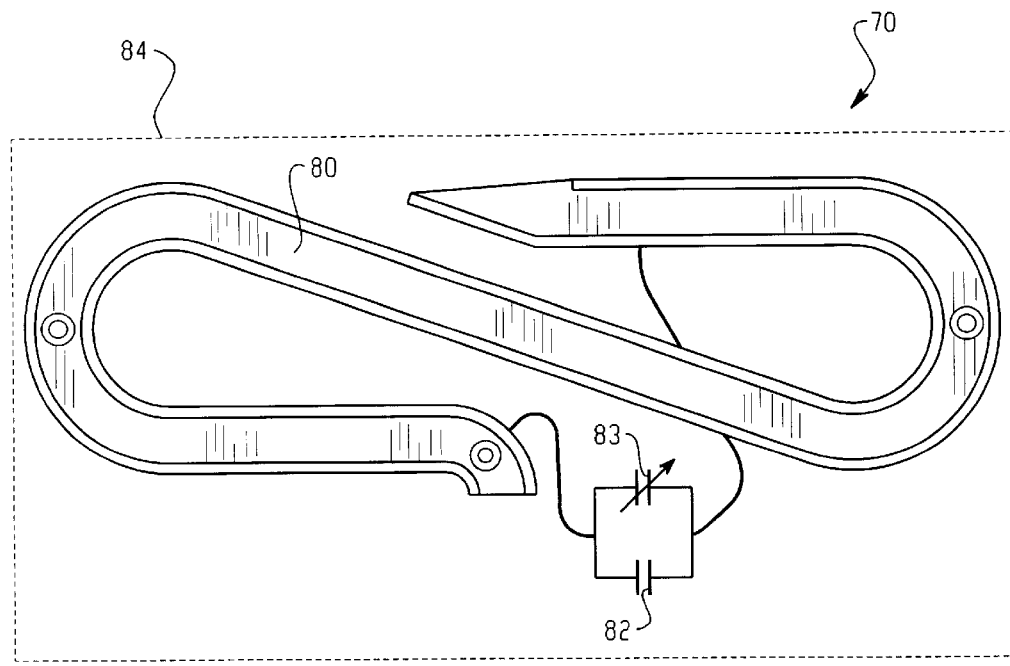
FIG. 2A is a plan view of the one preferred embodiment wherein a spatially distributed inductor takes the form of an "S" shaped trough.
Figure 2B:
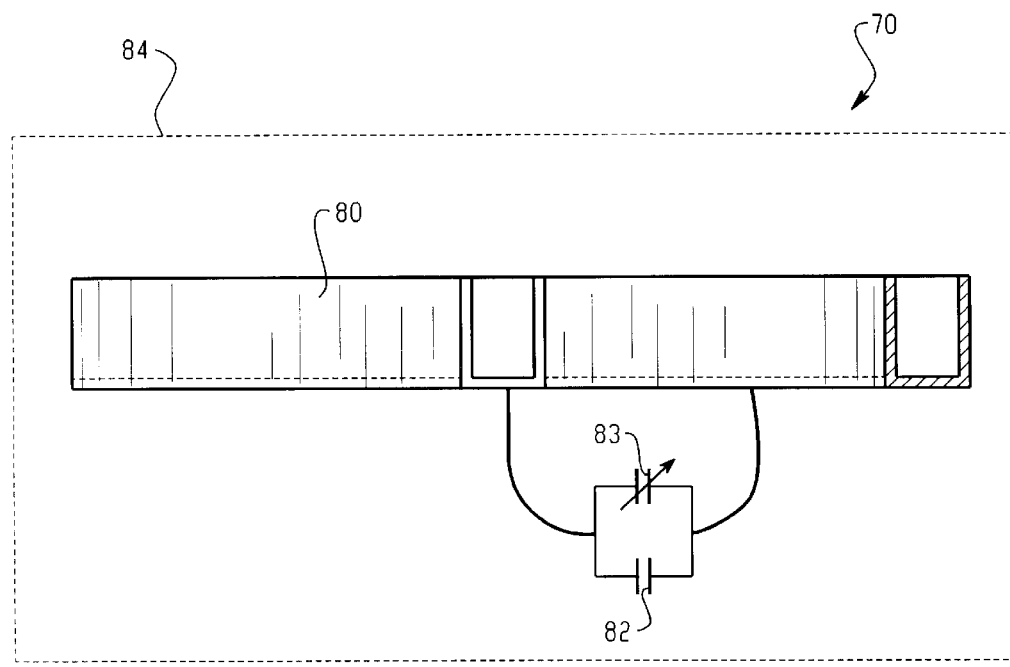
FIG. 2B is a side view of the embodiment of FIG. 2A, with a portion of the trough cross-sectioned.

Optionally, the resonant circuit is contained in an RF-shielding box 84 which is shown schematically in FIGS. 2A and 2B. The shielding box 84 preferably has a removable lid (not shown). The cables 60 are added or removed from the RF cable trap simply by opening the RF-shielding box 84, dropping in or lifting out cables, and replacing the lid. In a preferred embodiment, RF-shielding box 84 is comprised of an insulating rigid material with a metallic coating. The metallic coating thickness should be sufficiently thick to provide adequate shielding, while also being thin enough to avoid supporting long time-constant (>1 msec) eddy currents. The maximum cable capacity is limited by the area of the trough cross-section 86, and is preferably about twenty cables. of course, this maximum capacity may be increased by deepening or widening the trough and changing the capacitance of tuning capacitor 82 as necessary to maintain the desired resonant frequency.

Figure 3:
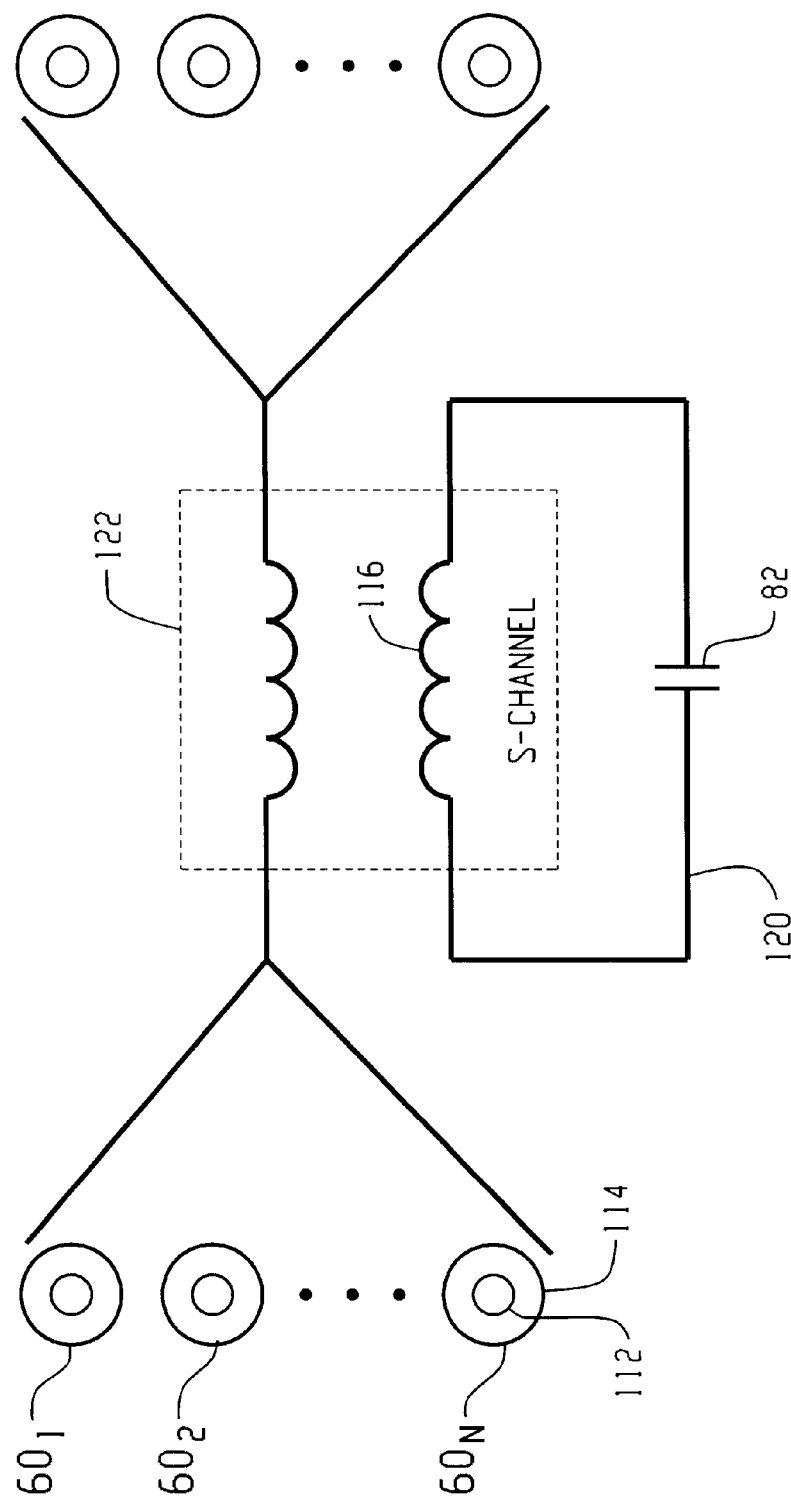
FIG. 3 is the electrical equivalent circuit diagram of the RF cable trap of FIG. 2.

The operation of the RF cable trap is described with reference to the electrical equivalent circuit diagram of the RF cable trap shown in FIG. 3. In this figure, the plurality of RF cables are represented by coaxial cables $60_1, 60_2, \ldots 60_N$ each comprising an inner conductor 112 and an outer axially concentric but electrically isolated conductor 114. Although coaxial cables are shown, other RF cable types such as triaxial cable may also be trapped by the RF cable trap. The RF cable trap consists of a spatially distributed inductor 116 which is inductively coupled to the RF cable shields 114, and a tuning capacitor 82 connected across the inductor to form a resonant circuit 120. The spatially distributed inductor 116 is schematically shown in FIG. 3 in a transformer configuration. Physically the inductor 116 geometry and placement relative to the cables 60 can take any physical form sufficient to produce efficient electromagnetic coupling at the resonance frequency so as to function like a transformer. In the exemplary FIG. 2, this form is the S-shaped channel 80. For efficient coupling, the cables 60 should be undulating or otherwise configured to facilitate electromagnetic interaction. In the exemplary FIG. 2, electromagnetic interaction is facilitated by placing the cables inside the S-shaped channel 80 so that the cables approximately conform with the S-shape. There is no D.C. conductive path between the cable inner and outer conductors 112 and 114, on the one hand, and the resonant circuit 120 on the other hand. Indeed, there does not need to be any direct physical contact at all between the resonant circuit 120 and the cables 60.

The inductance of the inductor 116 and the capacitance of the tuning capacitor 82 are designed to produce a resonant circuit with a resonant frequency corresponding to the RF working frequency of the cables. Mutual electromagnetic coupling between the resonant circuit and the cables generates a high impedance at the resonant frequency on the cable shields 114 which acts to block the RF currents on the shields 114.

With continuing reference to FIG. 3, preferably RF shielding 122 serves to isolate the resonant circuit and the cables in the vicinity of the circuit from outside influences. Electrical connection of the resonant circuit 120 to either electrical ground or to the RF shield 122, or to both, with appropriate inductance and/or capacitance adjustments being made to maintain the desired circuit resonant frequency, is also contemplated.

Figure 4:
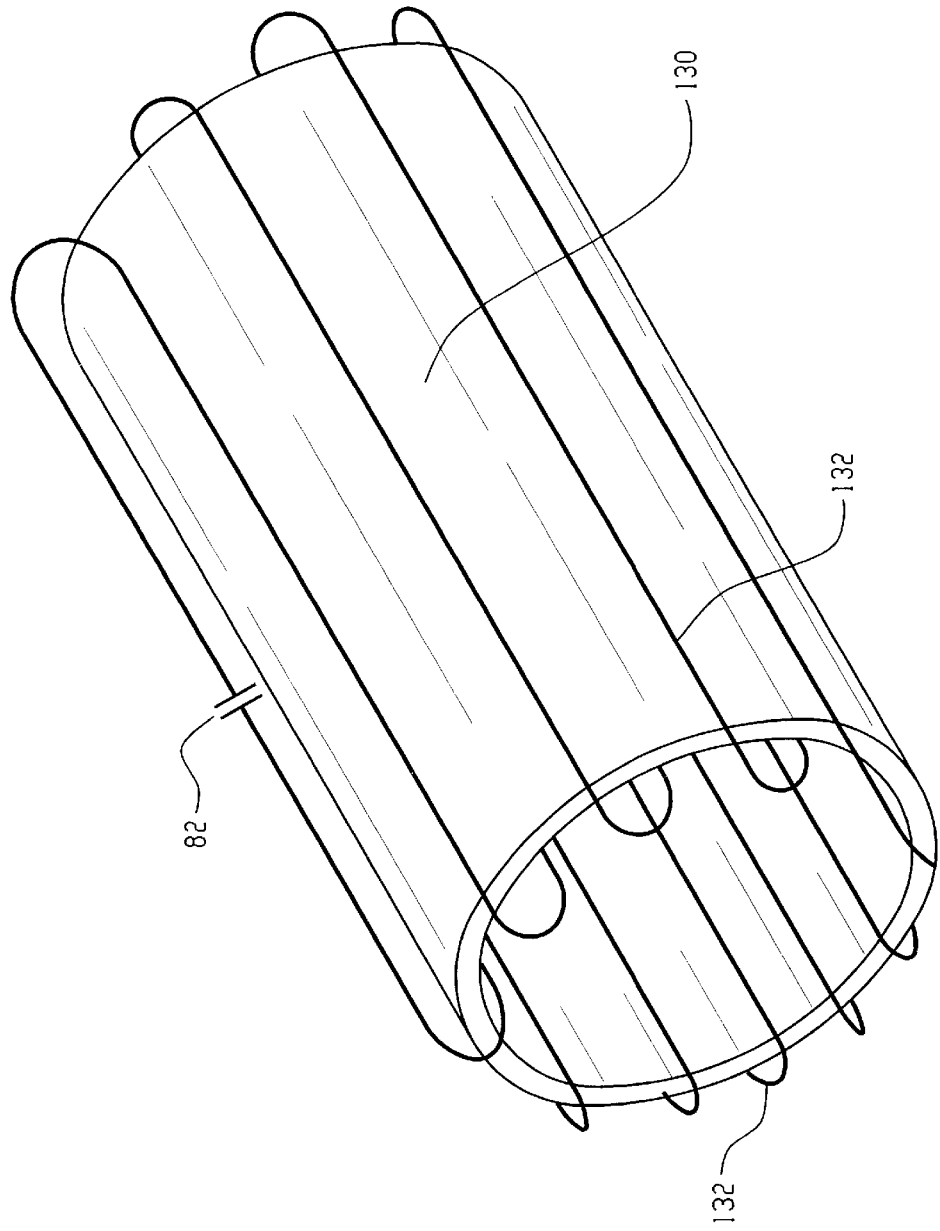
FIG. 4 is a perspective view of a second embodiment, with the spatially distributed inductor in the form of an air toroid.

FIG. 4 shows an alternate embodiment of the RF able trap. The inductor takes the form of an air toroid comprising an insulating cylinder 130 through which the RF cables pass, and an inductive coil 132 wrapped in a lengthwise fashion about cylinder 130. The tuning capacitor 82 is electrically connected across the coil ends to form a resonant LC circuit. Optionally, RF shielding encases the toroid. Particularly for smaller baluns, the RF shielding may be omitted.

Figure 5B:
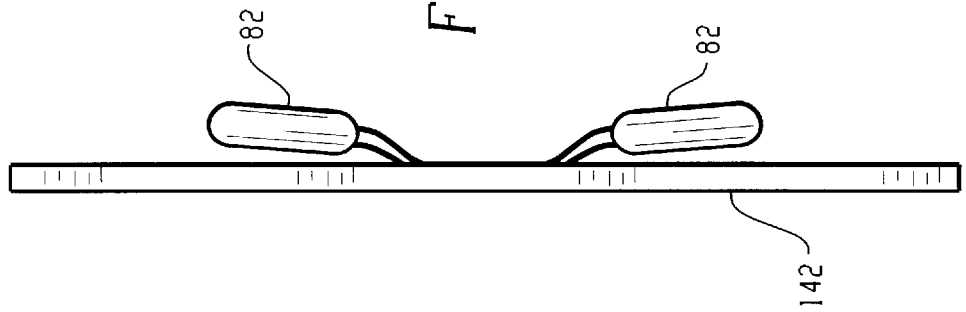
FIG. 5B is a side view of the embodiment of FIG. 5A.
Figure 5A:
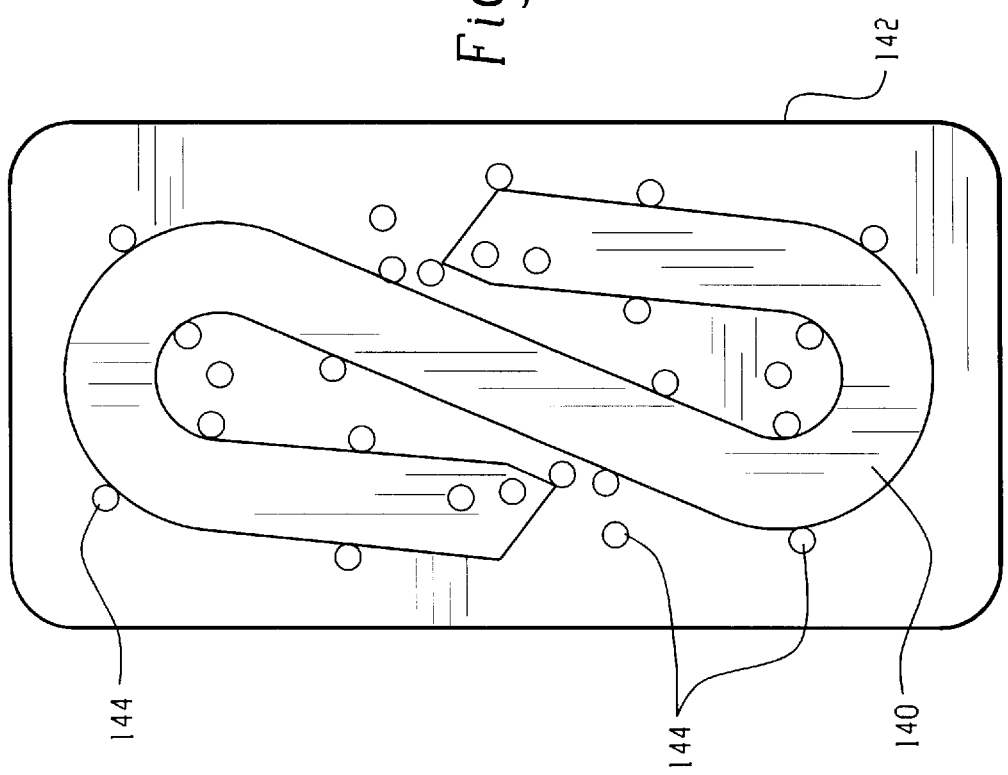
FIG. 5A is a plan view of a preferred embodiment in which the spatially distributed inductor takes the form of a metallic film deposited in the form of an "S" upon an insulating board.
Figure 5C:
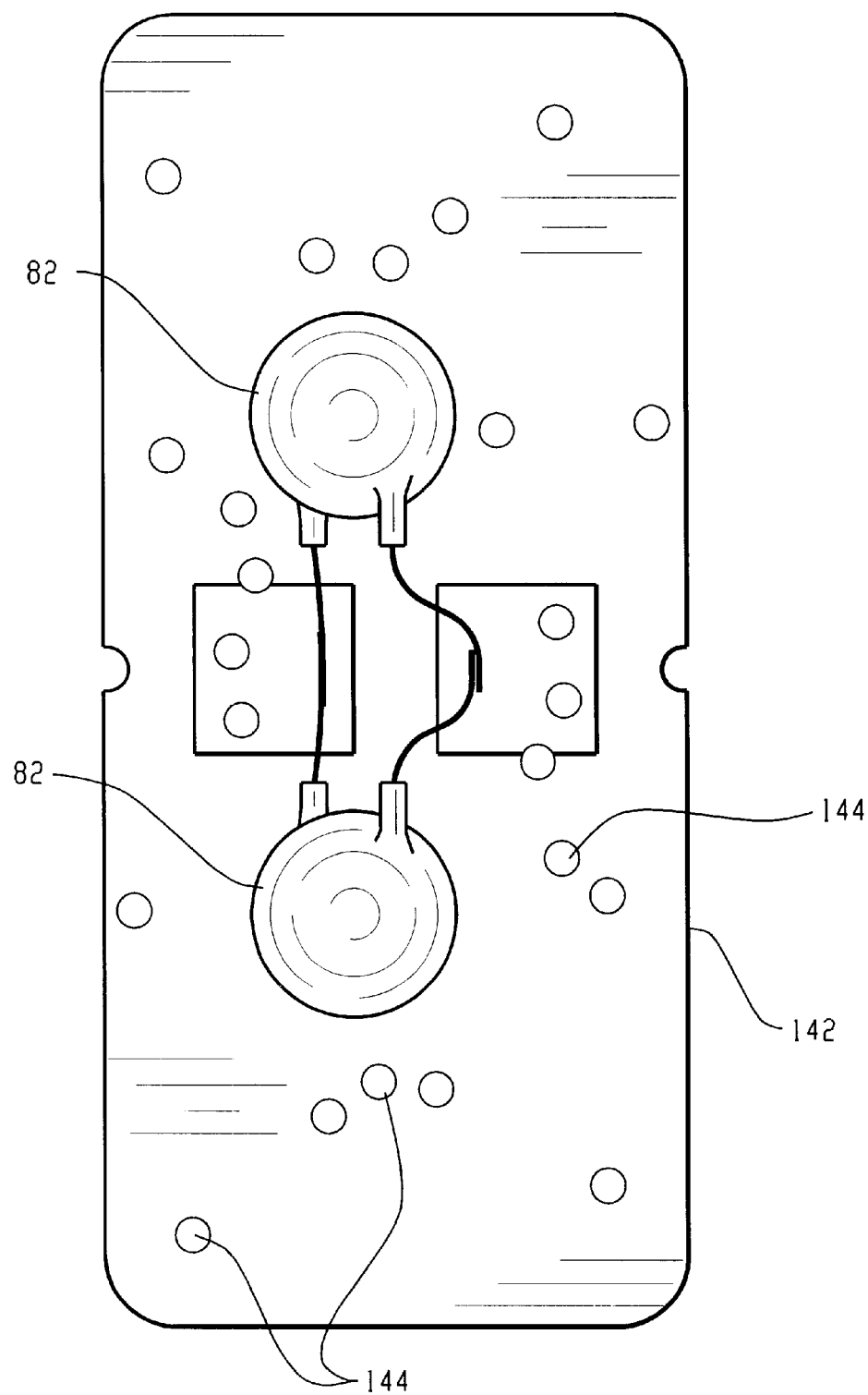
FIG. 5C is a backside view of the embodiment of FIG. 5A.

FIGS. 5A, 5B, and 5C show yet another alternate embodiment. The inductor takes the form of a metallized pattern 140 applied to a flat insulating board 142. The ends of the metallized pattern are electrically connected through tuning capacitors 82 to form the resonant LC circuit. The shape of the metallized pattern is shown as an "S" for compactness, but other continuous curved patterns, or even a straight metallized path, are also contemplated. Unlike the previous embodiments, here the RF cables are not physically encompassed by the spatially distributed inductor; rather, the cables are physically held in close proximity to the metallized pattern by ties or posts 144.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance apparatus having a main magnet which generates a main magnetic field through an examination region, at least one RF coil assembly positioned adjacent the examination region, a radio frequency transmitter which drives the RF coil assembly to excite magnetic resonance dipoles in a RF transmit field within the examination region, a multi-channel receiver connected by shielded transmission cables to at least one RF coil assembly which receives and demodulates the magnetic resonance signals, and further including:

a multi-channel RF cable trap including a spatially distributed inductor whose geometry and placement relative to the shielded transmission cables facilitates electromagnetic coupling between the inductor and the shielded transmission cables, the inductor being a part of an LC circuit which has a resonance frequency which matches a frequency of magnetic resonance signals transmitted to the multi channel receiver to block stray induced RF currents and noise from entering the receiver.

2. The magnetic resonance apparatus according to claim 1, wherein the LC circuit is electrically floating.

3. The magnetic resonance apparatus according to claim 1 wherein the shielded cables each include a peripheral shield and at least one interior conductor, and wherein the multi-channel RF cable trap includes:

a conductive layer inductively coupled to the peripheral shields of a plurality of the shielded cables.

4. A magnetic resonance apparatus having a main magnet which generates a main magnetic field through an examination region, at least one RF coil assembly positioned adjacent the examination region, a radio frequency transmitter which drives the RF coil assembly to excite magnetic resonance dipoles in a RF transmit field within the examination region, a multi-channel receiver connected by shielded transmission cables to at least one RF coil assembly which receives and demodulates the magnetic resonance signals, and further including:

a multi-channel RF cable trap including:

an "S" shaped trough formed from electrically insulating material and coated with an electrically conducting layer whose geometry and placement relative to the shielded transmission cables facilitates electromagnetic coupling between the "S" shaped trough and the shielded transmission cables; and a capacitor means forming an LC circuit with the "S" shaped trough tuned to block stray induced RF currents and noise from entering the receiver.

5. The magnetic resonance apparatus according to claim 4, wherein:

the LC circuit has a resonance frequency which matches a frequency of magnetic resonance signals transmitted to the multi-channel receiver.

6. The magnetic resonance apparatus according to claim 4, wherein the electrically conducting layer is sufficiently thin that electrical eddy currents are at negligible levels while simultaneously being thicker than a skin depth at a frequency of the signals carried on the shielded transmission cables.

7. The magnetic resonance apparatus according to claim 4, wherein the conducting layer has a thickness of between 1 μm and 4 μm inclusive.

8. The magnetic resonance apparatus according to claim 4, wherein:
the electrically insulating material forming the "S" shaped trough is acrylonitrile butadiene styrene resin; and
the electrically conducting layer is a coating of metallic paint.

9. The magnetic resonance apparatus according to claim 4, further including:
a box with an open top and including pass-throughs for the shielded transmission cables, the box being formed from electrically insulating material and coated with an electrically conducting layer, said layer being sufficiently thin to inhibit long time-constant eddy currents while simultaneously being sufficiently thick to adequately shield the cable trap; and
a removable lid fitted to the open top of the box, the removable lid being formed from electrically insulating material and coated with an electrically conducting layer, said layer being sufficiently thin to inhibit long time-constant eddy currents while simultaneously being sufficiently thick to adequately shield the cable trap.

10. The magnetic resonance apparatus according to claim 9, wherein the "S" shaped trough has an inductance of about 160 nanohenries, the tuning capacitor has a capacitance of about 39 picofarads, and the impedance of the LC circuit at 63 MHz is approximately 2250 ohms.

11. A magnetic resonance apparatus having a main magnet which generates a main magnetic field through an examination region, at least one RF coil assembly positioned adjacent the examination region, a radio frequency transmitter which drives the RF coil assembly to excite magnetic resonance dipoles in a RF transmit field within the examination region, a multi-channel receiver connected by shielded transmission cables to at least one RF coil assembly which receives and demodulates the magnetic resonance signals, and a multi-channel trap including:
an inductive element inductively coupled to shielding conductors of the shielded transmission cables; and
a resistive element which presents a resistance to signals on the shielding conductor at least at a frequency of the magnetic resonance to absorb stray induced RF currents.

12. The magnetic resonance apparatus according to claim 11 wherein the multi-channel RF cable trap further includes:
a tuning capacitor electrically connected across the inductor to form an LC circuit.

13. The magnetic resonance apparatus according to claim 12, wherein at least one terminal of the tuning capacitor is additionally connected to electrical ground.

14. The magnetic resonance apparatus according to claim 12, wherein the RF cable trap further includes:
an external RF shield, one terminal of the tuning capacitor being electrically connected to the RF shield.

15. The magnetic resonance apparatus according to claim 12, wherein the spatially distributed inductor includes:
a hollow insulating cylinder through which the shielded transmission cables pass; and
a conducting wire wrapped about the cylinder in a toroidal fashion.

16. The magnetic resonance apparatus according to claim 12, wherein the spatially distributed inductor comprises:
a thin conducting layer inductively coupled to the shield layer of the shielded transmission cables; and
a means for affixing the shielded transmission cables semi-permanently in close proximity to the thin conducting layer.

17. A multi-channel RF trap for blocking stray signals on a plurality of shielded RF cables which each have a peripheral shield conductor and at least one inner conductor for carrying RF signals, the multi-channel RF trap comprising:
a conductive layer inductively coupled to the shield conductors of the plurality of shielded RF cables; and,
capacitive coupling between the conductive layer and the shield conductor, the capacitive coupling being sized and the conductive layer being shaped such that the capacitive and inductive couplings define an LC circuit with a resonance frequency at a frequency of RF signals carried on the inner conductor.

18. The multi-channel RF trap according to claim 17, wherein the conductive layer has an "S"-shaped configuration.

19. A multi-channel RF trap for blocking stray signals on a plurality of shielded RF cables which each have a peripheral shield conductor and at least one inner conductor for carrying RF signals, the multi-channel RF trap comprising:
a conductive layer inductively coupled to the shield conductors of the plurality of shielded RF cables, the plurality of shielded RF cables and the conductive layer being together folded into an "S" shaped configuration.

20. The multi-channel RF trap according to claim 19 further including:
capacitive coupling between the conductive layer and the shield conductor, the capacitive coupling being sized and the conductive layer being shaped such that the capacitive and inductive couplings define an LC circuit with a resonance frequency at a frequency of RF signals carried on the inner conductor.

21. A method of magnetic resonance comprising:
exciting magnetic resonance in dipoles of a subject such that magnetic resonance signals are generated at least at a resonance frequency;
spatially encoding the magnetic resonance signals;
picking up resonance signals and conveying the resonance signals on a center conductor of a cable, which center conductor is surrounded by a shield conductor;
inductively attenuating signals on the shield conductor with at least one LC circuit which is resonant within a frequency spectrum that encompasses the resonance frequency;
demodulating the resonance signals from the center conductor; and,
reconstructing the demodulated magnetic resonance signals into an image representation.

22. A method for trapping RF currents in a shielded cable carrying signals at a working RF frequency, the method comprising:
inductively coupling a spatially distributed resonant electrical circuit in close proximity to the shielded cable, the spatially distributed resonant electrical circuit including:
a spatially distributed inductor; and
a capacitor means electrically connected across the inductor to form an LC circuit, the resonant electrical circuit having a sufficiently high impedance at the working RF frequency to attenuate stray RF currents and noise in the cable.

* * * * *